(12) United States Patent
Park et al.

(10) Patent No.: US 7,923,309 B2
(45) Date of Patent: Apr. 12, 2011

(54) THIN FILM TRANSISTOR ARRAY SUBSTRATE AND METHOD FOR MANUFACTURING THE SAME

(75) Inventors: Yong In Park, Gyeonggi-do (KR); Jae Young Oh, Gyeonggi-do (KR); Soo Pool Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 124 days.

(21) Appl. No.: 11/639,776

(22) Filed: Dec. 14, 2006

(65) Prior Publication Data

US 2007/0164284 A1 Jul. 19, 2007

(30) Foreign Application Priority Data

Dec. 29, 2005 (KR) .................. 10-2005-0134119

(51) Int. Cl.
*H01L 21/00* (2006.01)
(52) U.S. Cl. ............. 438/151; 349/187; 257/E27.111
(58) Field of Classification Search .......... 438/149, 438/151, 30, 158; 349/42, 43, 187; 257/E21.535, 257/E27.111
See application file for complete search history.

(56) References Cited

U.S. PATENT DOCUMENTS

| | | | | |
|---|---|---|---|---|
| 6,642,074 B2* | 11/2003 | Hong et al. | ............... | 438/30 |
| 2002/0093600 A1 | 7/2002 | Chol | | |
| 2002/0160555 A1* | 10/2002 | Hong et al. | ............. | 438/158 |
| 2003/0197182 A1* | 10/2003 | Kim et al. | ................ | 257/72 |
| 2003/0197187 A1* | 10/2003 | Kim et al. | ................ | 257/83 |
| 2004/0036073 A1* | 2/2004 | Hong et al. | ............... | 257/72 |
| 2004/0119903 A1 | 6/2004 | Chang et al. | | |
| 2004/0129943 A1* | 7/2004 | Yoo et al. | ................ | 257/72 |
| 2004/0185641 A1* | 9/2004 | Tanabe et al. | ............. | 438/487 |
| 2004/0263747 A1 | 12/2004 | Chae | | |
| 2005/0023534 A1* | 2/2005 | Hong et al. | ............... | 257/72 |
| 2005/0077516 A1* | 4/2005 | Lim et al. | ................ | 257/59 |
| 2005/0112790 A1* | 5/2005 | Lan et al. | ................ | 438/30 |
| 2005/0231669 A1* | 10/2005 | Kim | ..................... | 349/138 |
| 2006/0146210 A1* | 7/2006 | Lim | ..................... | 349/38 |
| 2007/0002249 A1 | 1/2007 | Yoo et al. | | |
| 2007/0164284 A1* | 7/2007 | Park et al. | ................ | 257/59 |
| 2007/0187689 A1* | 8/2007 | Oh et al. | ................. | 257/72 |

FOREIGN PATENT DOCUMENTS

| | | |
|---|---|---|
| CN | 1251914 | 5/2000 |
| JP | H05-175500 | 7/1993 |
| JP | 2001-250958 A | 9/2001 |
| JP | 2001-257350 | 9/2001 |
| JP | 2001-264804 | 9/2001 |
| JP | 2001-339072 | 12/2001 |

(Continued)

OTHER PUBLICATIONS

Search Report dated May 23, 2007 for corresponding Great Britain Patent Application No. GB0625091.4.

(Continued)

*Primary Examiner* — Matthew C Landau
*Assistant Examiner* — Latanya Crawford
(74) *Attorney, Agent, or Firm* — Brinks Hofer Gilson & Lione

(57) ABSTRACT

A thin film transistor array substrate and a method for manufacturing the thin film transistor array substrate are disclosed. Specifically, a thin film transistor array may be formed using a reduced number of masks.

12 Claims, 16 Drawing Sheets

FOREIGN PATENT DOCUMENTS

| | | |
|---|---|---|
| JP | 2002-107762 | 4/2002 |
| JP | 2005-122185 A | 5/2005 |

OTHER PUBLICATIONS

Office Action issued in corresponding Japanese Patent Application No. 2006-330266; issued Nov. 4, 2009.

Office Action issued in corresponding Chinese Patent Application No. 200610168254X; issued Oct. 30, 2009.

Office Action issued in corresponding Japanese Patent Application No. 2006-330266; issued Aug. 11, 2010.

\* cited by examiner

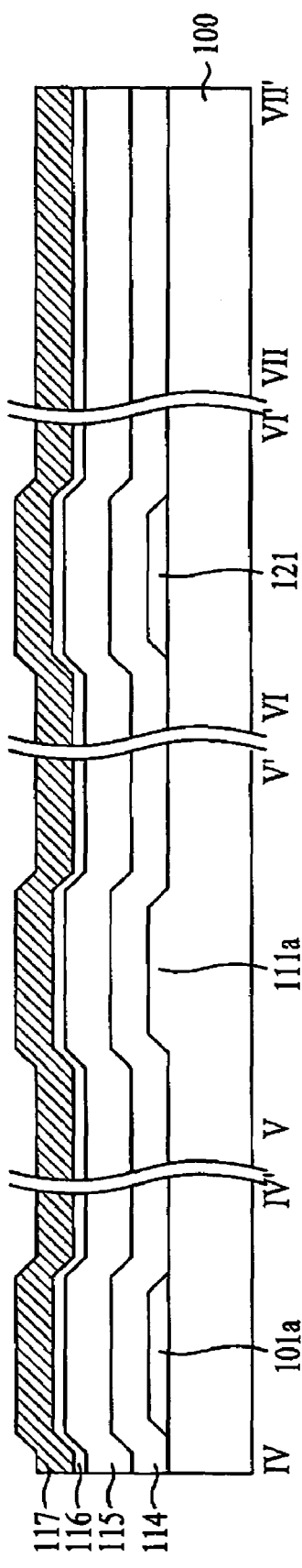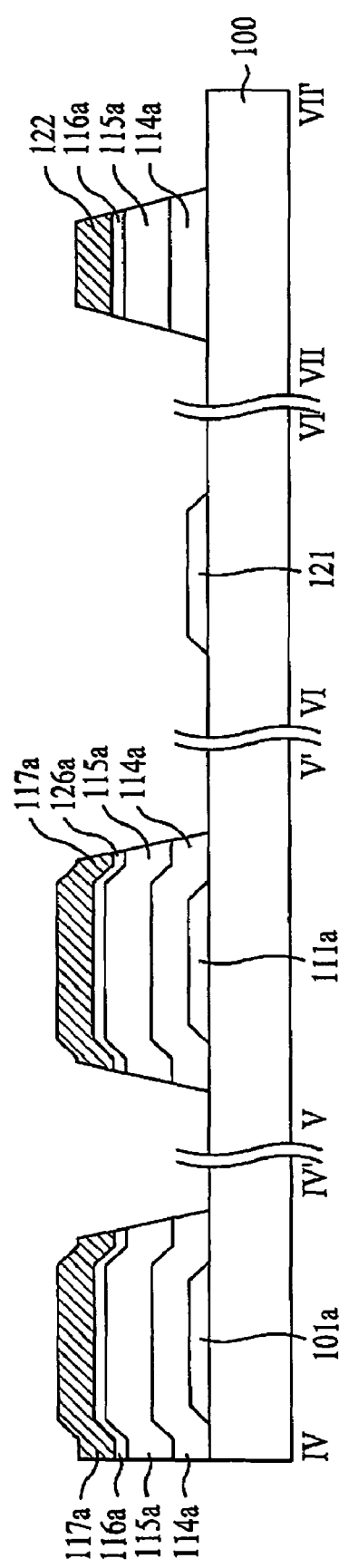

THIN FILM TRANSISTOR ARRAY SUBSTRATE AND METHOD FOR MANUFACTURING THE SAME

This application claims the benefit of Korean Patent Application No. P2005-134119, filed on Dec. 29, 2005, which is hereby incorporated by reference as if fully set forth herein.

BACKGROUND OF THE DISCLOSURE

1. Field of the Disclosure

The present disclosure relates to a liquid crystal display (LCD), and more particularly, to a thin film transistor array substrate and a method for manufacturing the thin film transistor array.

2. Discussion of the Related Art

With the progress of information-dependent society, the demand for various display devices has increased. To meet such a demand, efforts have been made to develop flat panel display devices such as liquid crystal display (LCD) devices, plasma display panels (PDPs), electro-luminescent display (ELD) devices, vacuum fluorescent display (VFD) devices, and the like. Some types of such flat panel display devices are being applied to various devices and/or appliances for display purposes.

LCDs have been used as a substitute for cathode ray tubes (CRTs) in association with mobile image display devices because LCDs have advantages of superior picture quality, light weight, thinness, and low power consumption. Various applications of LCDs are being developed in association with not only mobile image display devices such as monitors of notebook computers, but also monitors of televisions to receive and display broadcasting signals. Successful application of LCDs to various image display devices depends on whether or not the LCDs can produce desired high picture quality including high resolution, high brightness, and large display area, while maintaining its desired characteristics of lightness, thinness, and low power consumption.

LCDs have a structure including a first substrate and a second substrate joined together in such a manner that a space is established between the first and second substrates. A liquid crystal layer is sealed in the space between the first and second substrates. The first substrate includes a plurality of gate lines arranged in one direction while being uniformly spaced apart from one another. A plurality of data lines are arranged in a direction perpendicular to the gate lines while being uniformly spaced apart from one another. The crossing of the data lines and the gate lines define pixel regions P. The first substrate also includes a plurality of pixel electrodes formed at respective pixel regions P, and a plurality of thin film transistors (TFTs) T each formed at an intersection between one of the gate lines and one of the data lines. A data signal on each data line is applied to one of the pixel electrodes in response to a signal applied to one of the gate lines.

Although not shown, the second substrate may include a black matrix layer for blocking incident light to regions other than the pixel regions P. The second substrate may also include R, G, and B color filter layers formed at a region corresponding to each pixel region P, and configured to reproduce color tones. A common electrode may be disposed on the color filter layers, and configured to reproduce an image.

In the above-described LCD, the liquid crystals of the liquid crystal layer arranged between the first and second substrates in each pixel region may be oriented in a certain direction by an electric field generated between the pixel electrode and the common electrode. The amount of light passing through the liquid crystal layer is controlled based on the orientation of the liquid crystal layer, in order to appropriately represent an image.

An LCD having the above-mentioned driving principle is called a twisted nematic (TN) mode LCD. In addition to such a TN mode LCD, an in-plane switching (IPS) mode LCD has been developed which uses a horizontal electric field. In the IPS mode LCD, a pixel electrode and a common electrode are formed on a first substrate at each pixel region of the first substrate such that the pixel electrode and common electrode extend parallel to each other, in order to generate an in-plane electric field (horizontal field). The liquid crystal layer may be oriented in a certain direction by the in-plane electric field.

The structures of TFTs formed at intersections between gate lines and data lines on a first substrate and pixel electrodes formed at pixel regions in LCDs as described above, and the processes for forming the TFTs and pixel electrodes will be described in association with FIGS. 1 and 2. FIG. 1 is a sectional view illustrating a TFT array substrate according to the related art. FIG. 2 is a flow chart illustrating a method for manufacturing a TFT array substrate according to the related art.

As shown in FIG. 1, each TFT of the thin film transistor array substrate includes a gate electrode 11 disposed, such that it is protruded from the gate line (not shown). A semiconductor layer 13 is disposed in the form of an island above the gate electrode 11 such that a gate insulating layer 12 is disposed between the gate electrode 11 and the semiconductor layer 13. Each TFT also includes a source electrode 14a and a drain electrode 14b respectively disposed at opposite sides of the semiconductor layer 13 while being spaced apart from each other. The source electrode 14a is formed to be protruding from the data line (not shown). The semiconductor layer 13 may have a laminated structure including a lower amorphous silicon layer 13a, and an upper impurity layer (n+ layer) 13b disposed on the amorphous silicon layer 13a except for a channel region. The impurity layer 13b is in contact with lower surfaces of the source electrode 14a and drain electrode 14b.

A pixel electrode 16 is disposed such that it is in contact with a portion of an upper surface of the drain electrode 14b in each TFT. A passivation layer 15 is formed, as an interlayer, between the pixel electrode 16 and each of the source electrode 14a and drain electrode 14b. The above-described structure formed on the first substrate 10 is referred to as a "TFT array". A method for manufacturing the TFT array will be described in conjunction with one TFT with reference to FIG. 2. FIG. 2 is a flow chart showing a process for manufacturing a TFT array according to the related art.

As shown in FIG. 1 and FIG. 2, a metal layer is deposited over the first substrate 10, and is then selectively removed to form a gate line and a gate electrode 11 such that the gate electrode 11 is protruded from the gate line as in block 11S. Thereafter, a gate insulating layer 12 is deposited over the upper surface of the first substrate 10 including the gate electrode 11.

Subsequently, a semiconductor layer 13 and a metal layer are sequentially disposed on the upper surface of the gate insulating layer 12, and are then selectively removed to form a data line (not shown) and source and drain electrodes 14a and 14b as in block 12S. The semiconductor layer 13 has a laminated structure including a lower amorphous silicon layer 13a, and an upper impurity layer 13b. Since the semiconductor layer 13 is disposed beneath the source and drain electrodes 14a and 14b, it is patterned together with the metal layer upon the formation of the source and drain electrodes 14a and 14b. The region defined between the source and drain regions 14a and 14b is selectively subjected to a diffractive light exposure process such that the metal layer and the impurity layer 13b of the semiconductor layer 13 are removed from the region. The remaining portion of the semiconductor layer 13 is defined as a channel region.

A passivation layer 15 is then disposed on the upper surface of the gate insulating layer 12 including the data line, source electrode 14a and drain electrode 14b. A passivation layer hole is then formed to expose a portion of an upper surface of the drain electrode 14b as in block 13S. Thereafter, a transparent electrode material is deposited over the entire upper surface of the passivation layer 15 such that the passivation layer hole is buried by the transparent electrode material. The transparent electrode material may then be selectively removed to form a pixel electrode 16 in a pixel region as in block 14S.

However, the above-mentioned TFT array substrate according to the related art may have certain drawbacks. In order to form the TFT array substrate and a TFT transistor array on the TFT array substrate, it may be necessary to use at least four masks for the formation of the gate lines, the formation of the semiconductor layer and data lines, the formation of the passivation layer holes, and the formation of the pixel electrodes.

Such masks used to pattern desired films are expensive. Furthermore, every time a mask is used, it is necessary to perform various processes such as deposition of a film to be patterned, coating of a photoresist film, light exposure, development of the photoresist film, and etching of the film using the developed photoresist film. After completion of the etching process, it is also necessary to perform additional processes such as cleaning. For this reason, the use of masks incurs an increase in costs, an increase in processing time, and a degradation in productivity.

BRIEF SUMMARY

The present disclosure is directed to a thin film transistor array substrate and a method for manufacturing the same that substantially obviate one or more problems due to limitations and disadvantages of the related art. A thin film transistor array substrate may be manufactured using a reduced number of masks.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In a first aspect, a thin film transistor array substrate includes gate lines and data lines crossing each other to define pixel regions on a substrate. A plurality of thin film transistors are disposed adjacent to each crossing point of one of the gate lines and one of the data lines, each thin film transistor including a gate electrode protruded from the gate line, a source electrode protruded from the data line, and a drain electrode located adjacent the source electrode. A plurality of pixel electrodes located on the pixel regions are adjacent the drain electrode. A plurality of transparent electrode patterns are located adjacent one of the data lines. The source electrodes protrude from the data line.

In a second aspect, a thin film transistor array substrate includes a plurality of gate lines and a plurality of data lines crossing the plurality of gate lines. One of the plurality of gate lines crosses one of the plurality of data lines to establish pixel regions on a substrate. A plurality of common lines are disposed substantially parallel with the gate lines. A plurality of thin film transistors are disposed adjacent to crossing points of the gate lines and the data lines, wherein each thin film transistor comprises a gate electrode protruding from the gate line, a source electrode protruding from the data line, and a drain electrode adjacent the source electrode. A plurality of first storage electrodes disposed on at least one of the drain electrodes. A plurality of pixel electrodes are disposed to extend from one of the first storage electrodes in each pixel region. A plurality of transparent electrode patterns are configured to be located apart from the first storage electrode and in contact with the source electrode. A plurality of common electrodes are disposed in each pixel region and alternating with the pixel electrodes.

In a third aspect, a method for manufacturing a thin film transistor array substrate includes forming gate lines and gate electrodes on a substrate. A gate insulating layer, a semiconductor formation layer, and a data metal layer are deposited on a surface of the substrate including the gate lines and the gate electrodes. At least part of the data metal layer, the semiconductor formation layer, and the gate insulating layer are removed, such that data lines extend substantially perpendicular to the gate lines. A transparent electrode layer is deposited over a surface of the substrate including the data lines. At least part of the transparent electrode layer, the data metal layer, and the semiconductor formation layer are removed to a predetermined depth.

In a fourth aspect, a method for manufacturing a thin film transistor array substrate includes forming gate lines, gate electrodes, and gate pad patterns on a substrate. A gate insulating layer, a semiconductor formation layer, and a data metal layer are deposited over an upper surface of the substrate. At least a part of the data metal layer, the semiconductor formation layer, and the gate insulating layer are selectively removed to form data lines extending substantially perpendicular to the gate lines. The semiconductor formation layer regions remain. A transparent electrode layer is deposited over an upper surface of the substrate. The transparent electrode layer, the data metal layer, and the semiconductor formation layer are removed to a predetermined depth such that semiconductor layers and source and drain electrodes are disposed in respective semiconductor formation layer regions.

In a fifth aspect, a method for manufacturing a thin film transistor array substrate includes disposing gate lines and common lines extending in substantially the same direction on a substrate. Common electrodes, gate electrodes, and gate pad patterns are also disposed on the substrate. A gate insulating layer, a semiconductor formation layer, and a data metal layer are deposited on a surface of the substrate including the gate lines, the common lines, the common electrodes, the gate electrodes, and the gate pad patterns. At least part of the data metal layer, the semiconductor layer formation layer, and the gate insulating layer are selectively removed to form data lines extending substantially perpendicular to the gate lines. Semiconductor layer formation regions are established by the selective removal. A transparent electrode layer is deposited over a surface of the substrate including the data lines. At least part of the transparent electrode layer, the data metal layer, and the semiconductor formation layer are removed to a predetermined depth. The removal of at least part of the transparent electrode layer establishes semiconductor layers, source electrodes and drain electrodes in respective semiconductor layer formation regions.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims and be defined by the following claims. Nothing in this section should be taken as a limitation on those claims. Further aspects and advantages are discussed below in conjunction with the embodiments.

It is to be understood that both the foregoing general description and the following detailed description of the present invention are exemplary and explanatory and are intended to provide further explanation of the invention as claimed.

BRIEF DESCRIPTION OF THE DRAWINGS

The system and/or method may be better understood with reference to the following drawings and description. Non-limiting and non-exhaustive embodiments are described with reference to the following drawings. The components in the figures are not necessarily to scale, emphasis instead being placed upon illustrating the principles of the invention. In the figures, like referenced numerals designate corresponding parts throughout the different views.

The accompanying drawings, which are included to provide a further understanding of the invention and are incorporated in and constitute a part of this application, illustrate embodiment(s) of the invention and together with the description serve to explain the principle of the invention. In the drawings:

FIGS. 10A to 10D are plan views illustrating processing of the TFT array substrate manufacturing according to a second embodiment;

DETAILED DESCRIPTION

Reference will now be made to the embodiments of the present disclosure. The embodiments are associated with an LCD inspection apparatus and an LCD inspection method using the same, examples of which are illustrated in the annexed drawings. Wherever possible, the same reference numbers will be used throughout the drawings to refer to the same or like parts. Herein, the phrase "coupled with" is defined to mean directly connected to or indirectly connected through one or more intermediate components. Such intermediate components may include both hardware and software based components.

Figure 1:
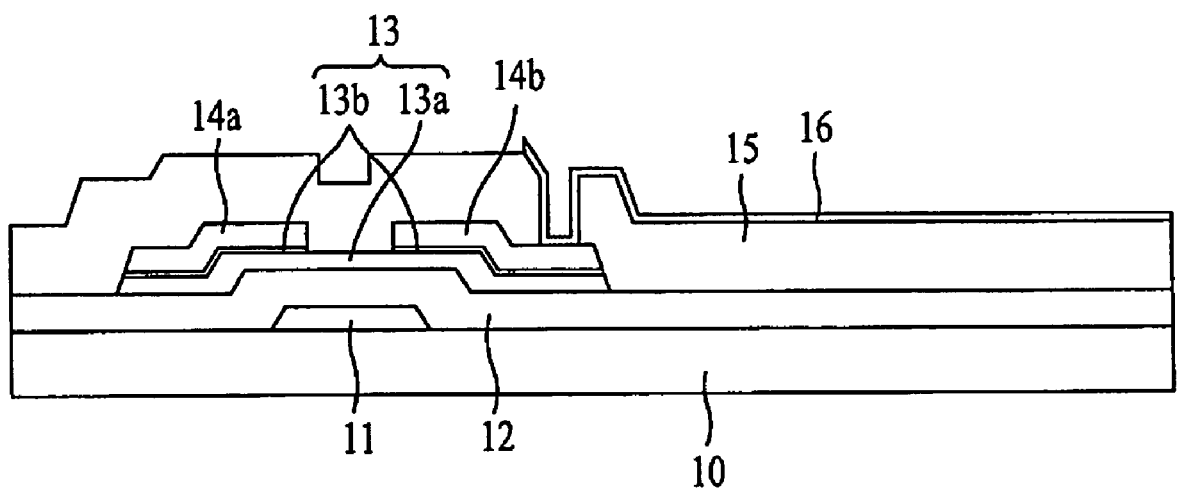
FIG. 1 is a sectional view illustrating a thin film transistor (TFT) array substrate according to the related art.
Figure 2:
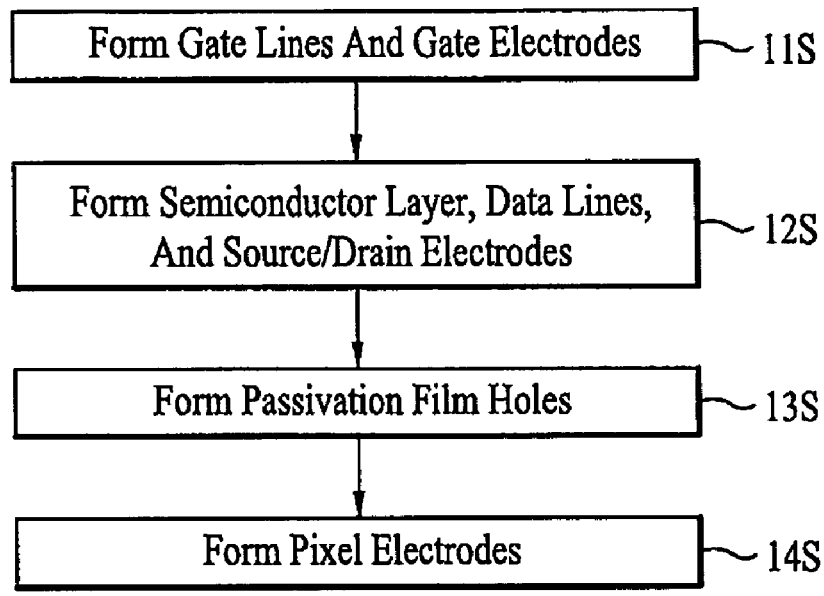
FIG. 2 is a flow chart illustrating a method for manufacturing a TFT array substrate according to the related art.
Figure 3:
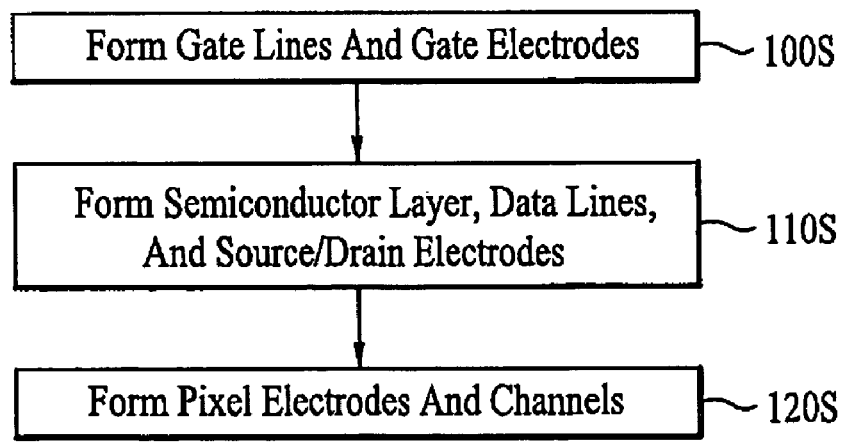
FIG. 3 is a flow chart illustrating a method for forming a TFT array of a TFT array substrate in accordance with one embodiment.

FIG. 3 is a flow chart illustrating a method for forming a thin film transistor (TFT) array of a TFT array substrate in accordance with an embodiment. As shown in FIG. 3, in accordance with a TFT array substrate manufacturing method, formation of a TFT array is achieved using a first mask for formation of gate lines and gate electrodes as in block 100S. A second mask is used for formation of a semiconductor layer and a data line layer as in block 110S. A third mask for formation of pixel electrodes and formation of channels in the semiconductor layer as in block 120S.

In accordance with a TFT array substrate manufacturing method of one embodiment, the pixel electrodes are formed or disposed directly on the data line layer without interposition of a passivation layer between the data line layer and the pixel electrode layer. Accordingly, it may be unnecessary to additionally use a process for forming passivation layer holes. This reduces the number of masks to be used in the manufacturing process. Channels are defined upon the patterning of the pixel electrodes. Accordingly, it is unnecessary to use a diffractive light exposure process conventionally required upon formation of channels, thereby achieving a reduction in the number of light exposure processes. The above-described TFT array substrate manufacturing method and the structure of the TFT array formed in accordance with the manufacturing method will be described in conjunction with various embodiments described below.

Figure 4:
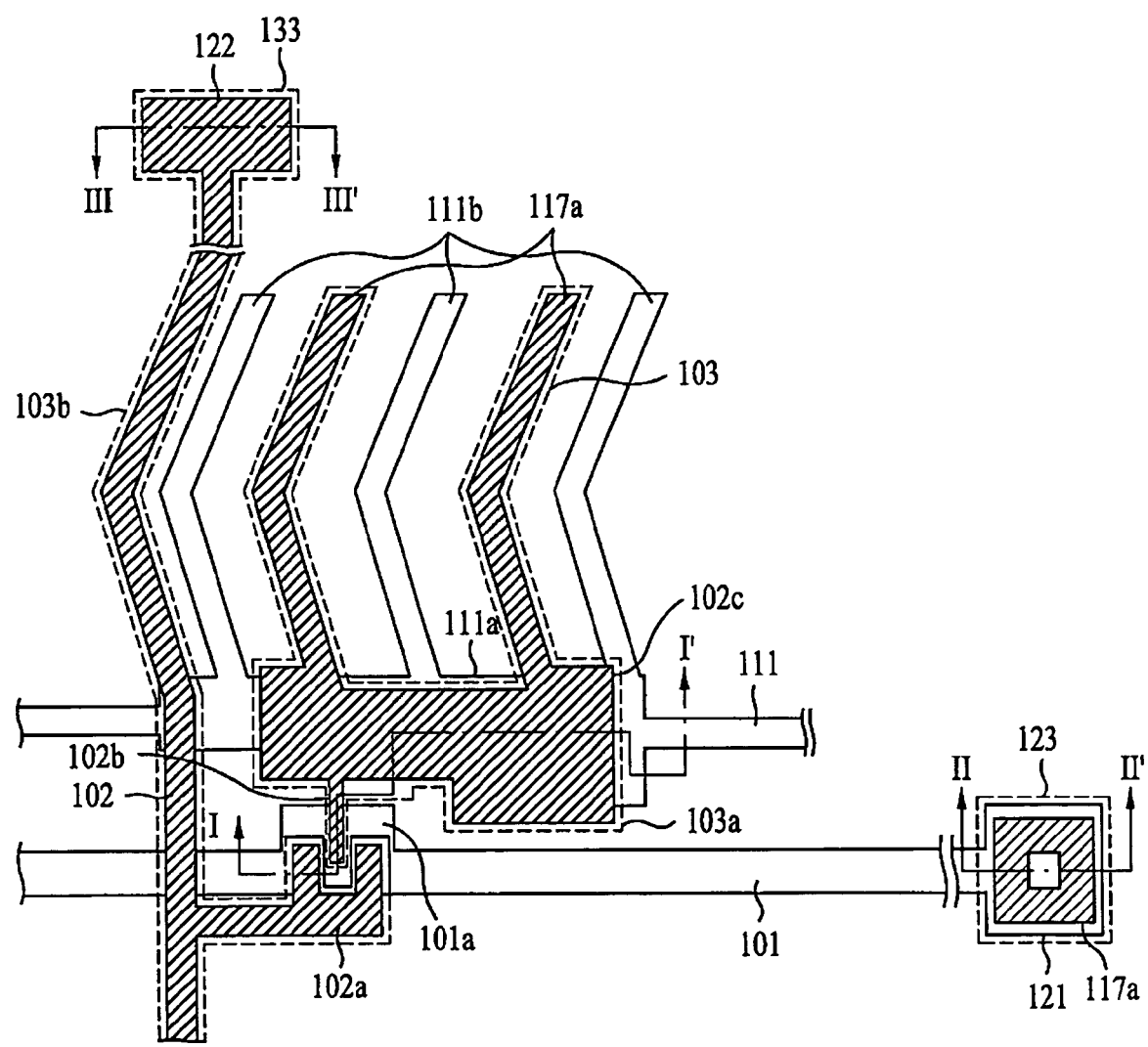
FIG. 4 is a plan view illustrating a TFT array substrate according to a first embodiment.
Figure 5:
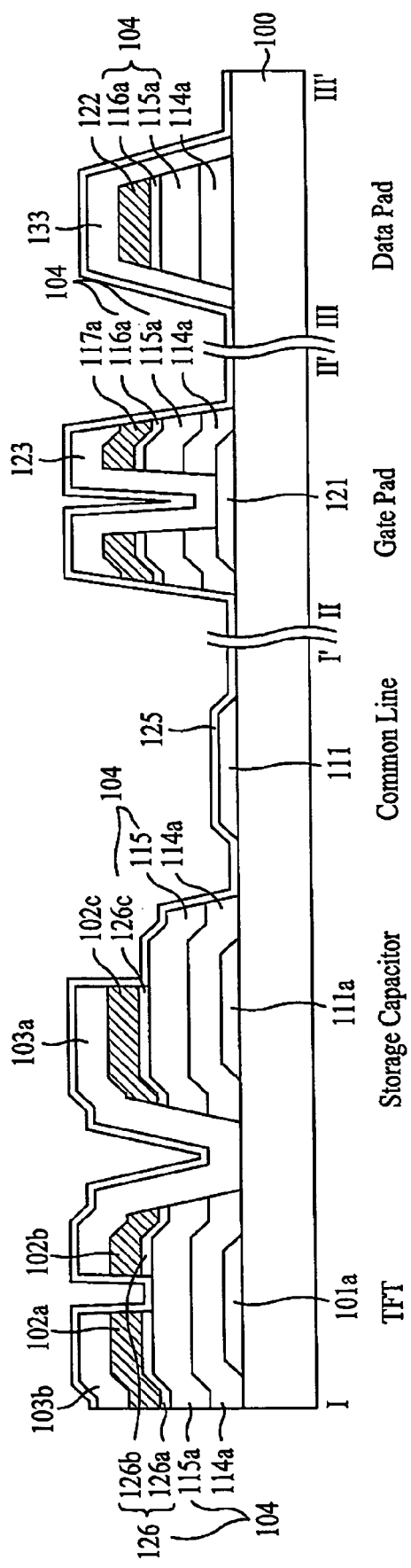
FIG. 5 is a cross-sectional view taken along the lines I-I', II-II', and III-III' of FIG. 4.

A first embodiment of the present disclosure relates to a TFT array substrate for an in-plane switching (IPS) mode LCD, which is formed using three masks, and a method for manufacturing the TFT array substrate. FIG. 4 is a plan view illustrating the TFT array substrate according to the first embodiment of the present disclosure. FIG. 5 is a cross-sectional view taken along the lines I-I', II-II', and III-III' of FIG. 4. Here, the line I-I' extends through a TFT, the line II-II' extends through a storage capacitor and a common line, and the line III-III' extends through a data pad.

In the following description, the central portion of the TFT array substrate according to one embodiment is defined as a display area where an image display is carried out, whereas the portion of the TFT array substrate around the display area is defined as a pad area to which a certain drive signal is applied. A plurality of pixel regions are defined in the display area.

As shown in FIGS. 4 and 5, the TFT array substrate according to the first embodiment, a first substrate 100, includes, in the display area thereof, a plurality of gate lines 101 and a plurality of data lines 102 defining pixel regions on the substrate 100 at intersections of the gate lines 101 and data lines 102. In the display area, the substrate 100 also includes a plurality of TFTs each including a gate electrode 101a protruded from one of the gate lines 101 at the intersection between the gate line 101 and one of the data lines 102. A source electrode 102a protrudes from the data line 102 at the intersection between the gate line 101 and the data line 102. A drain electrode 102b protrudes from the data line 102 at the intersection between the gate line 101 and the data line 102 while being spaced apart from the source electrode 102a. The substrate further includes, in the display area, common lines 111 disposed to be parallel to respective gate lines 101. First storage electrodes 111a are each disposed integrally with one of the common lines 111, and arranged in one of the pixel regions, while having a larger width than that of the common line. Common electrodes 111b are each disposed in one of the pixel regions such that the common electrode 111b is forked in the form of fingers from one of the first storage electrodes 111a. In other words, the common electrodes 111b may extend individually from one of the first storage electrodes 111a. The common electrodes 111b are substantially perpendicular to the gate lines 101 and the common lines 111.

Pixel electrodes 103 are disposed to alternate with the common electrodes 111b, and second storage electrodes 103a are disposed integrally with one of the pixel electrodes 103 while being partially overlapped with a region where one of the first storage electrodes 111a is arranged.

The substrate 100 also includes a pad area. In the pad area, gate pad patterns 121 are disposed at an end of one of the gate lines 101 in one of regions where gate pads are defined. Data pad patterns 122 are disposed at an end of one of the data lines 102 in one of regions where data pads are defined. A data pattern layer 117a and a gate pad terminal 123 are disposed in a laminated state over each gate pad pattern 121. A data pad terminal 133 is disposed over each data pad pattern 122. The gate pad terminals 123 and data pad terminals 133 are made of a transparent electrode material forming the same layer as the pixel electrodes 103.

A transparent electrode pattern 103b is disposed to be in contact with the source electrode 102a and drain electrode 102b of each TFT, which are arranged below the transparent electrode pattern 103b. A storage pattern 102c is formed integrally with the drain electrode 102b of each TFT. Each second storage electrode 103a is formed on one of the storage patterns 102c such that they are in contact with each other.

The data pattern layer 117a is also formed beneath one of the pixel electrodes 103 while being integrated with one of the storage patterns 102c. Each transparent electrode pattern 103b is formed on one of the data lines 102. The transparent electrode patterns 103b are made of the same material as the pixel electrodes 103. Referring to both FIGS. 4 and 5, it can be seen that a data metal layer for forming the data lines and a transparent electrode layer for forming the pixel electrodes are patterned in the form of laminated patterns in most of the regions where the data lines, pixel electrodes, and storage capacitors are to be formed.

The transparent electrode patterns 103b may be arranged on the data lines 102 and the data pattern layers 117a arranged beneath the pixel electrodes 103 may not be needed. This can be achieved by changing the shapes of opening or shielding portions of the second mask for patterning the data lines 102 and the shapes of opening or shielding portions of the third mask for patterning the pixel electrodes. The third mask should have light transmitting portions (when the third mask is made of a photoresist film having a positive photoresistivity) corresponding to respective channel portions of the semiconductor layer because the third mask should define channels. When the third mask is made of a photoresist film having a negative photoresistivity, it should have light shielding portions. When patterning is carried out using the third mask having the above-described structure, one source electrode 102a and one drain electrode 102b are defined at portions of the data pattern layer 117a corresponding to a semiconductor layer 104 of each TFT, respectively. Accordingly, an amorphous silicon layer 116a is removed from a region corresponding to a channel of the semiconductor layer 104.

As described, the transparent electrode layer is formed directly over the patterned data line layer without formation of a passivation layer over the patterned data line layer. This may enable the channel of the semiconductor layer 104 to be defined in the process for etching the transparent electrode layer. Accordingly, the source and drain electrodes 102a and 102b, transparent electrode pattern 103b, and second storage electrode 103a in each TFT region may be simultaneously formed.

As shown in FIG. 5, a gate insulating layer 114a is formed not only on the gate lines 101, gate electrodes 101a, first storage electrodes 111a, and gate pad patterns 121, but also on the data pad area. The semiconductor layer 104 is laminated over the gate insulating layer 114a. The semiconductor layer 104 has a laminated structure including an amorphous silicon layer 115a and an impurity layer (n+ layer) 116a or 126. The impurity layer 126 may include first and second impurity layers 126a and 126b, which are removed from the channel regions. The data pattern layer 117a, impurity layer 116a, amorphous silicon layer 115a, and gate insulating layer 114a are removed by a predetermined width from a region corresponding to a predetermined portion of each gate pad pattern 121, in order to expose the predetermined portion of the gate pad pattern 121. Each gate pad terminal 123 is formed using a transparent electrode material configured to cover at least the exposed portion of the gate pad pattern 121.

Each first storage electrode 111a forms a storage capacitor, together with the storage pattern 102c and second storage electrode 103a formed above the first storage electrode 111a such that the storage pattern 102c and second storage electrode 103a are in contact. The gate insulating layer 114a is interposed between the first storage electrode 111a and the storage pattern 102c. A passivation layer 125 is disposed over the uppermost surface of the substrate 100, using an oxide in one embodiment.

Although not shown, a color filter array may be disposed on a second substrate (not shown) facing the substrate 100. The second substrate includes a black matrix layer formed to cover a region other than the pixel regions and the TFTs. Color filter layers are disposed in at least the pixel regions, and an overcoat layer is disposed over the upper surface of the second substrate including the black matrix layer and color filter layers. The substrate 100 may be joined with the second substrate in a state in which a liquid crystal layer is sealed between the substrate 100 and the second substrate.

Figure 6A:
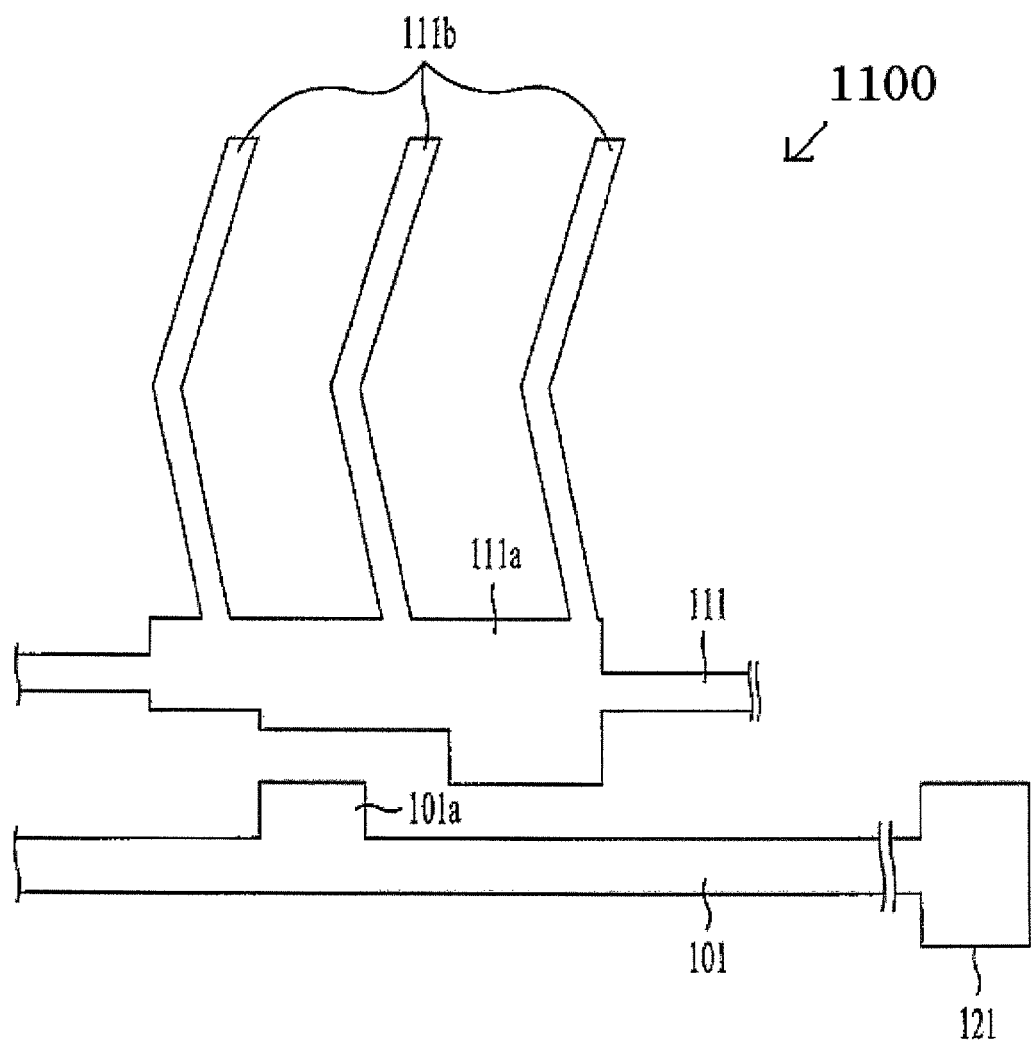
FIGS. 6A to 6C are plan views illustrating processing steps of the TFT array substrate manufacturing according to the first embodiment.
Figure 6B:
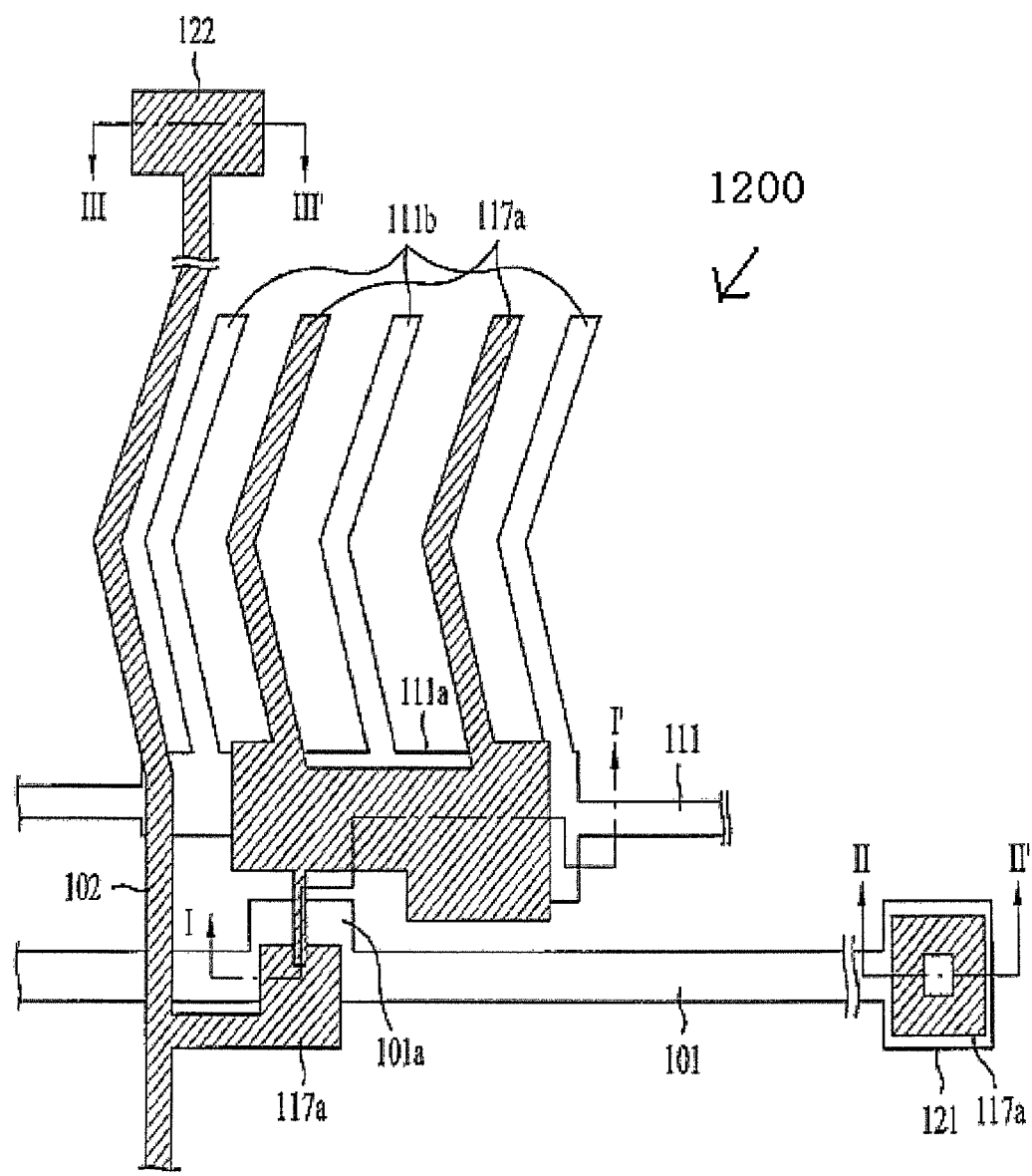
Figure 6C:
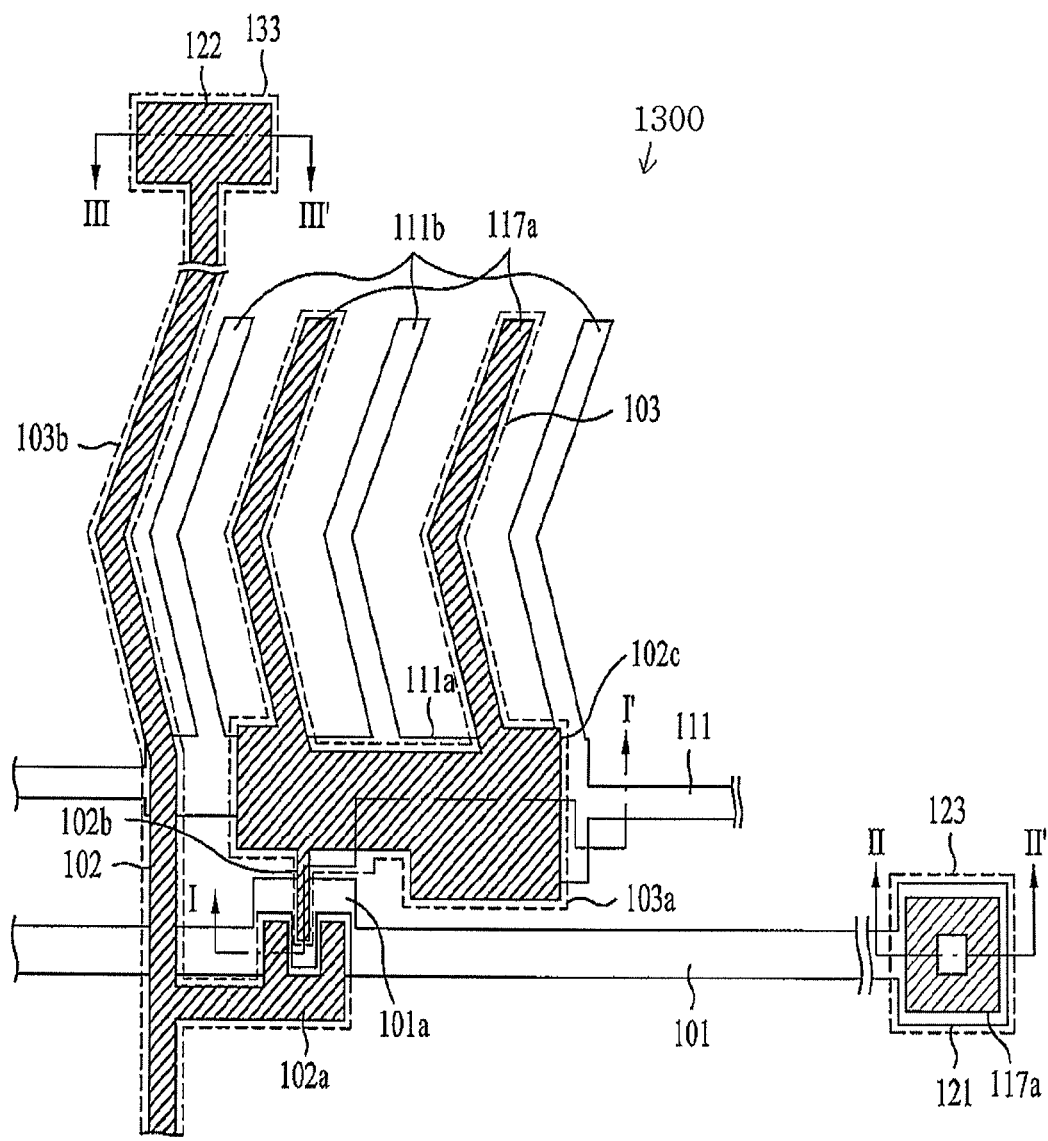

FIGS. 6A to 6C are plan views illustrating processing steps of the manufacture of a TFT array substrate according to a first embodiment. FIGS. 7A to 7E are sectional views illustrating processing steps of the manufacture of the TFT array substrate according to the first embodiment.

Figure 7A:
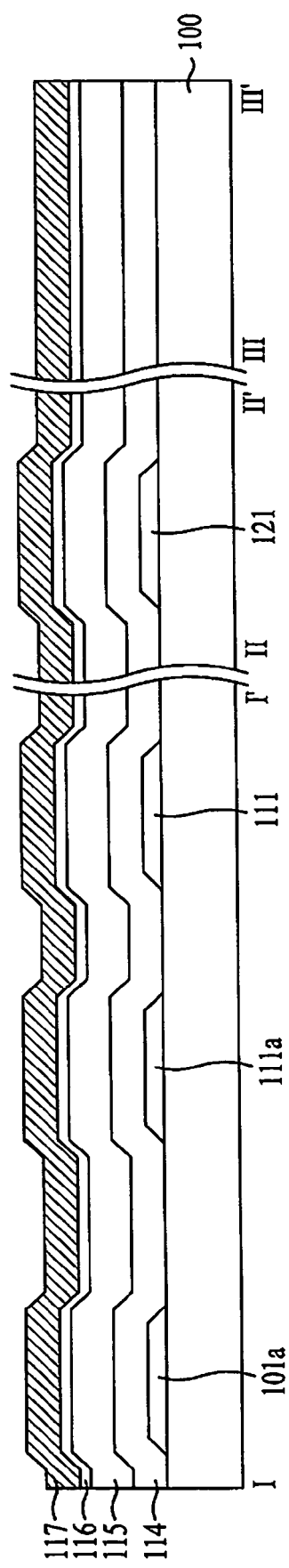
FIGS. 7A to 7E are sectional views illustrating processing steps of the TFT array substrate manufacturing according to the first embodiment.

As shown in FIGS. 6A and 7A, a gate metal layer is first deposited over the entire upper surface of the substrate 100. Thereafter, a first photoresist film (not shown) is coated over the entire upper surface of the gate metal layer. The first photoresist film is then subjected to a light exposure and development process, using a first mask 1100 (parts corresponding to 101, 101a, 111, 111a, 111b, 121 are shielding parts and the other part is open part in the first mask), so that the first photoresist film is patterned. Subsequently, a patterning process is carried out using the patterned first photoresist film. The gate metal layer is selectively removed, thereby forming a plurality of gate lines 101 extending in one direction, a plurality of common lines 111 extending in a direction substantially parallel to respective gate lines 101, and common electrodes 111b each forked in the form of fingers from one of the gate lines 101 or one of the common lines 111. In other words, the common electrodes 111b may extend individually from one of the gate lines 101, one of the common lines 111, or the first storage electrode 111a. The common electrodes 111b are substantially perpendicular to the gate lines 101 and the common lines 111.

Each common line 111 has an increased width at a portion corresponding to the pixel region, as compared to other common line portions, to define a first storage electrode 111a. The first storage electrode 111a forms a storage capacitor, together with a second storage electrode 103a and an insulating film interposed between the first storage electrode 111a and the second storage electrode 103a (shown in FIG. 6C). The second storage electrode 103a is formed integrally with a pixel electrode (designated by "103" in FIG. 7C) disposed on the common line 111 such that the pixel electrode is overlapped with the common line 111. The common line 111, first storage electrode 111a, and common electrode 111b are integrated.

In the above-described patterning process, gate electrodes 101a are also disposed to be protruded from portions of gate lines 101 at respective pixel regions. Simultaneously, a gate pad pattern 121 is formed at each gate line 101. Subsequently, a gate insulating layer 114, an amorphous silicon layer 115, an impurity layer (n⁺ layer) 116, and a data metal layer 117 are sequentially deposited over the entire upper surface of the substrate 100 including the elements 101, 101a, 111, 111a, and 111b, as shown in FIG. 7A.

Figure 7B:
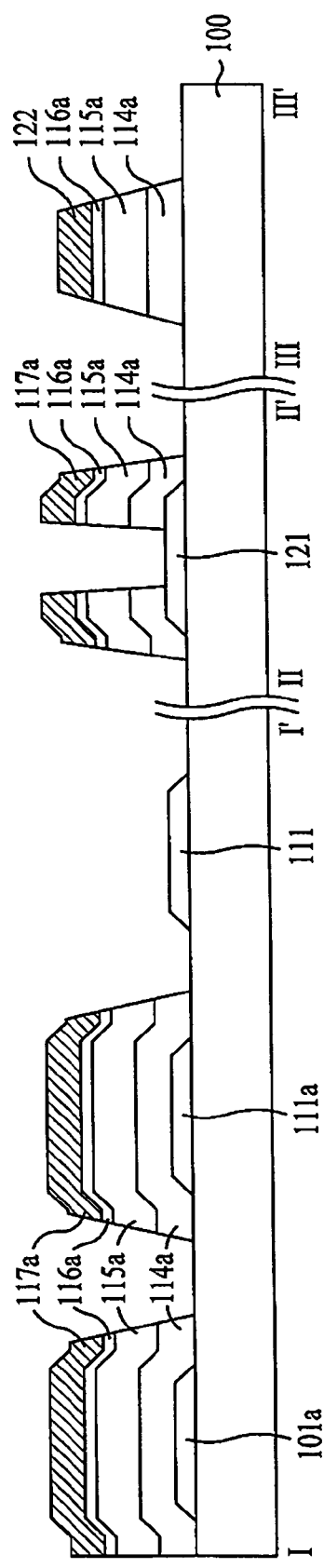
Figure 7C:
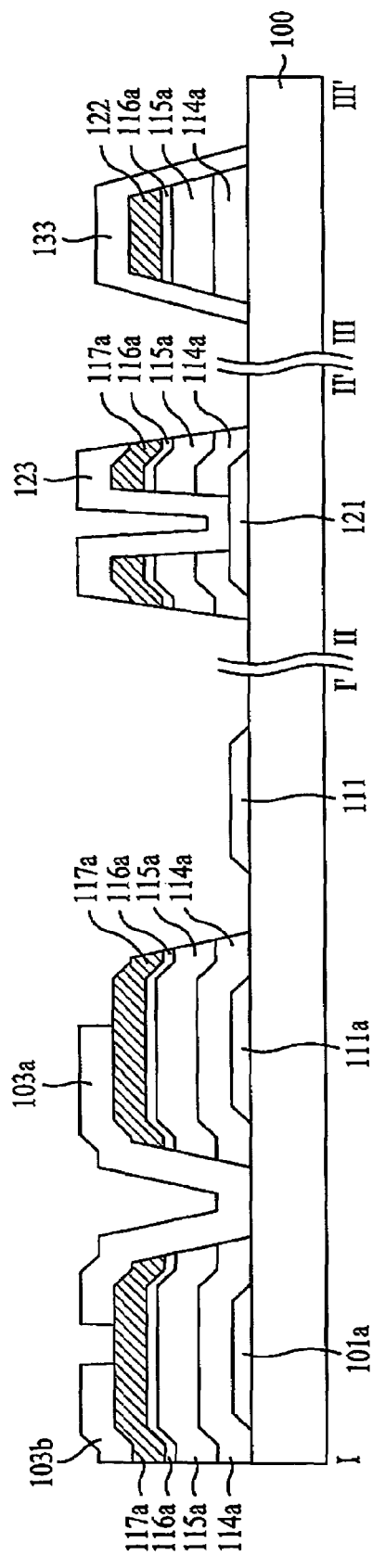

A second photoresist film (not shown) may be coated over the upper surface of the data metal layer 117, as shown in FIGS. 6B and 7B. The second photoresist film is then subjected to a light exposure and development process, using a second mask 1200 (hatching parts corresponding to 102, 117a, 122 are shielding parts and the other part is open part in the second mask), so that the second photoresist film is patterned. Subsequently, a patterning process is carried out, using the patterned second photoresist film, such that the data metal layer 117 is selectively removed, thereby forming a data pattern layer 117a. Using the data pattern layer 117a as a mask, the impurity layer 116 and amorphous silicon layer 115 arranged beneath the data pattern layer 117a are dry-etched, and then the gate insulating layer 114 is subsequently etched. In accordance with this process, an impurity pattern layer 116a, an amorphous silicon pattern layer 115a, and a gate insulating pattern layer 114a are formed which have a width substantially identical to that of the data pattern layer 117a. Alternatively, the width may be similar to that of the data pattern layer 117a (taking a side edge taper into consideration).

The data pattern layer 117a may be present in a region where data lines are to be formed, a region where a semiconductor layer including source and drain electrodes is to be formed, a region around each gate pad region, and each data pad region. The portion of the data pattern layer 117a arranged in each data pad region may be referred to as a data pad pattern 122.

In the etching process using the second mask 1200, data lines 102 are formed which extend perpendicularly to the gate lines 101, and thus, define pixel regions. A data pad pattern 122 is also formed at one end of each data line 102, namely, in each data pad region. In addition, a pattern is formed in each TFT region such that the pattern protrudes from one of the data lines 102. Also, another pattern is disposed in each storage capacitor region such that the pattern has portions arranged to alternate with portions of the common electrode 111b arranged in the storage capacitor region. In the above-described process, a predetermined portion of the upper surface of the gate pad pattern 121 arranged in each gate pad region is exposed. The upper surface of each common line 111 is also exposed.

A transparent electrode layer is deposited over the data pattern layer 117a including the data pad patterns 122, as shown in FIG. 7O. A third photoresist film (not shown) may then be coated over the upper surface of the transparent electrode layer. The third photoresist film may be subjected to a light exposure and development process, using a third mask 1300 (inner parts of dotted lines are shielding parts and the outer parts of the dotted lines are open parts in the third mask), so that the third photoresist film is patterned. Subsequently, a patterning process may be carried out using the patterned third photoresist film. The transparent electrode layer is selectively removed, thereby forming transparent electrode patterns 103b and pixel electrodes 103 on the data pattern layer 117a in respective pixel regions. Transparent electrode patterns 103b and pixel electrodes 103 may not be formed on the channel regions, gate pad terminals 123 on portions of the data pattern layer 117a arranged on respective gate pad patterns 121, and data pad terminals 133 on respective data pad patterns 122 and regions around the data pad patterns 122. The data pattern layer 117a arranged in each pixel region has portions arranged to alternate with those of the common electrode 111b previously formed in the pixel region, while being partially overlapped with the first storage electrode 111a arranged in the pixel region.

The gate lines and common lines 111 in an exposed state may be covered by another transparent electrode pattern formed upon the patterning of the transparent electrode layer in order to protect the surfaces of the gate lines and common lines 111. Such a transparent electrode pattern is not shown in the annexed drawings.

Figure 7D:
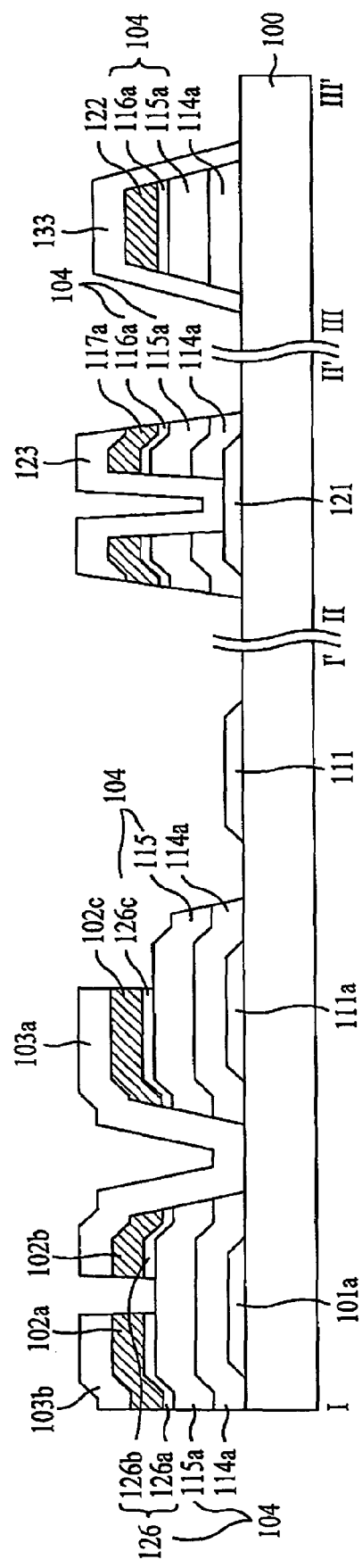

Using the transparent electrode patterns 103b and pixel electrodes 103 as a mask, the portions of the data pattern layer 117a and impurity layer 116a corresponding to respective channel regions are removed in accordance with an etching process, as shown in FIGS. 6C and 7D. The portion of the data pattern layer 117a left on each gate electrode 101a after completion of the etching process may be defined as a source electrode 102a and a drain electrode 102b arranged at opposite sides of the channel region while being spaced apart from each other. The portions of the impurity layer 126 (126a and 126b) and amorphous silicon layer left beneath the portion of the data pattern layer 117a are collectively defined as a semiconductor layer 104. In this embodiment, the source electrode 102a has a U-shape, and the channel defined between the source electrode 102a and the drain electrode 102b also has a U-shape. Such a shape is adapted to secure an increased area of the channel region. In alternate embodiments, the channel region may have other shapes such as an L-shape or "-"-shape.

Figure 7E:
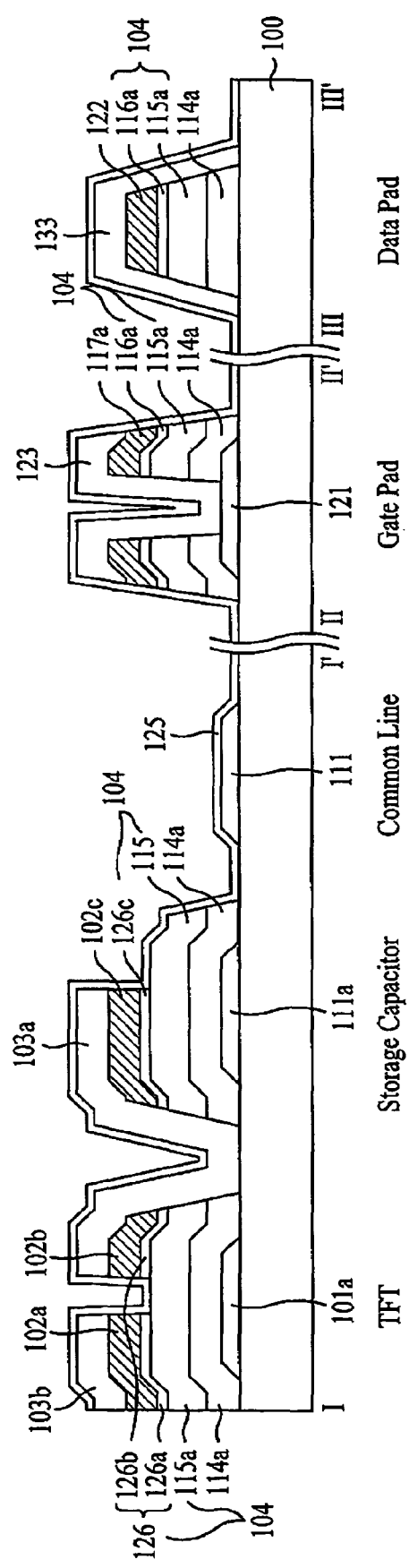

The substrate 100 may be treated with $O_2$ plasma, to form a passivation layer (not shown) (for example, "125" in FIG. 9) made of an oxide ($SiO_2$) over the elements formed on the substrate 100, as shown in FIG. 7E. The passivation layer is configured to protect the opened channel portions of the semiconductor layer 104 from an external environment. In one embodiment, the passivation layer 125 has a thickness of about 200 to 500 angstroms (Å). The formation of such a passivation layer may be achieved by loading a single substrate into a vacuum chamber, and then subjecting the substrate to a oxygen plasma process. Alternatively, the passivation layer formation may be achieved by loading a cassette or similar device carrying a plurality of substrates into an oven, and then subjecting the substrates to a oxygen plasma process and to a thermal oxidization process. An orientation film (not shown) may then be formed over the passivation layer 125. The orientation film may then be rubbed.

As described above, the TFT array substrate manufacturing method according to the first embodiment is achieved using three masks. In this TFT array substrate manufacturing method, formation of a passivation layer between the data line layer and the pixel electrodes may be unnecessary. Accordingly, the passivation layer hole formation process involved in the 4-mask process becomes unnecessary in this embodiment. The pixel electrodes are formed such that they are in contact with the data line layer, and each channel region is defined using the shape of the pixel electrode. Accordingly, it is possible to form a TFT array using three masks as described above, without using an additional diffractive light exposure process.

The second embodiment of the present disclosure relates to a TFT array substrate for a twisted nematic (TN) mode LCD, which is formed using three masks, and a method for manufacturing the TFT array substrate.

Figure 8:
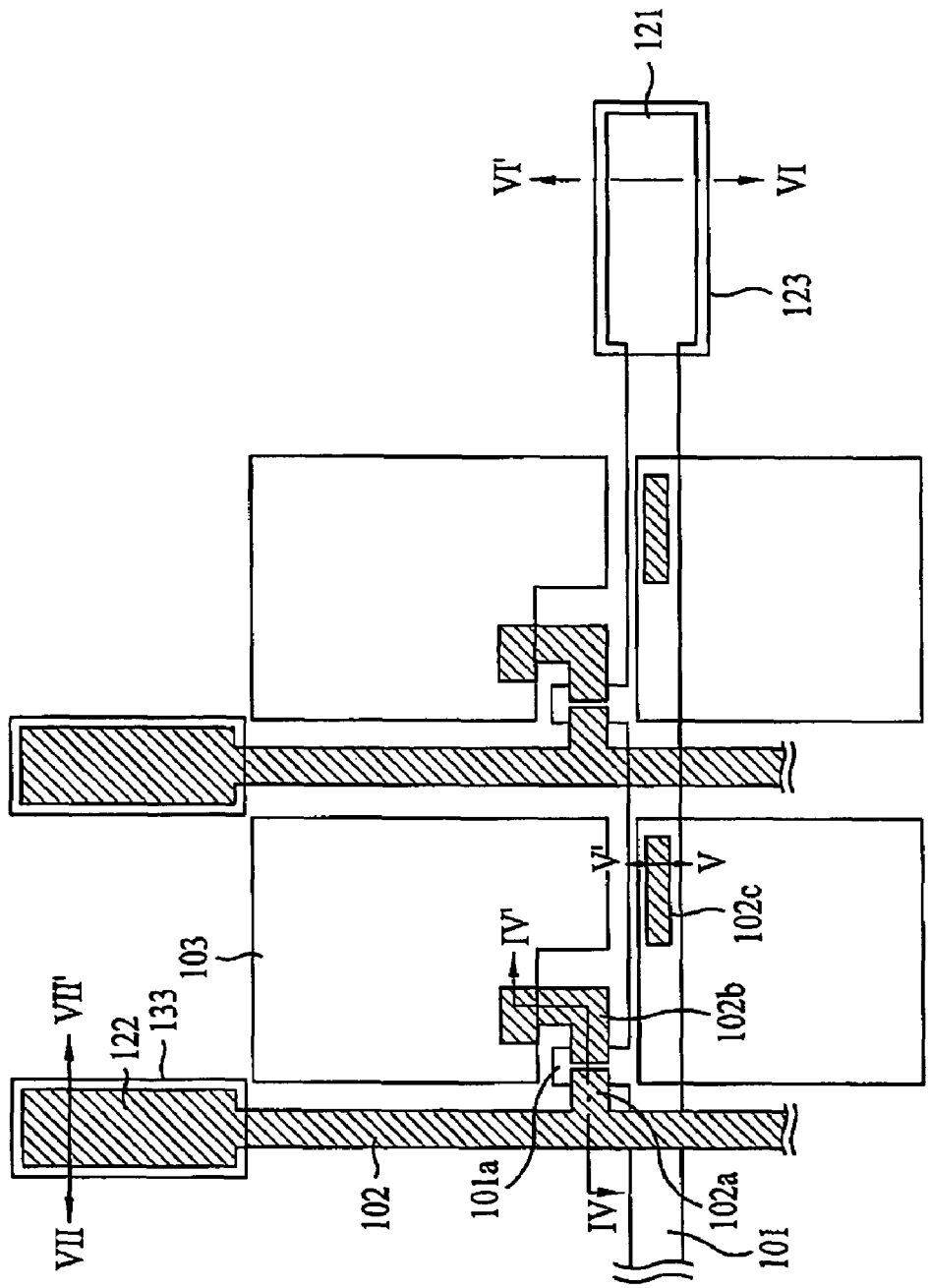
FIG. 8 is a plan view illustrating a TFT array substrate according to a second embodiment.
Figure 9:
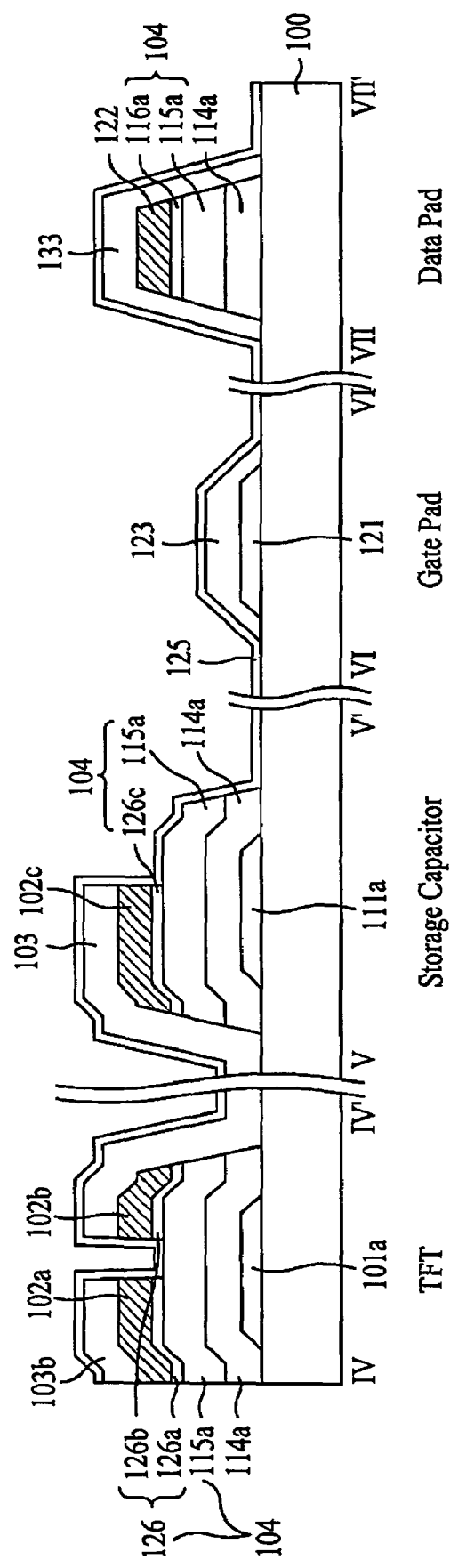
FIG. 9 is a cross-sectional view taken along the lines IV-IV', V-V', VI-VI', and VII-VII' of the TFT array substrate illustrated in FIG. 8.

FIG. 8 is a plan view illustrating the TFT array substrate according to the second. FIG. 9 is a cross-sectional view taken along the lines IV-IV', V-V', VI-VI', and VII-VII' of FIG. 8. The line IV-IV' extends through a TFT, the line V-V' extends through a storage capacitor, the line VI-VI' extends through a gate pad, and the line VII-VII' extends through a data pad.

As shown in FIGS. 8 and 9, the TFT array substrate according to the second embodiment includes, in the display area thereof, a plurality of gate lines 101 and a plurality of data lines 102 defining pixel regions on the substrate 100 at intersections of the gate lines 101 and data lines 102. In the display area, the substrate 100 also includes a plurality of TFTs. The TFTs include a gate electrode 101a protruded from one of the gate lines 101 at the intersection between the gate line 101 and one of the data lines 102, a source electrode 102a protruded from the data line 102 at the intersection between the gate line 101 and the data line 102, and a drain electrode 102b protruded from the data line 102 at the intersection between the gate line 101 and the data line 102 while being spaced apart from the source electrode 102a. The substrate 100 further includes, in the display area, pixel electrodes 103 formed in one of the pixel regions such that the pixel electrode 103 is overlapped with the gate line arranged upstream from the gate line associated with the pixel electrode 103 under the condition in which the pixel electrode 103 is in contact with an upper surface of the drain electrode 102b of the TFT in a predetermined region, and storage patterns 102c each formed on the same layer as the layer on which the data lines are formed, and arranged, as an interlayer, between one of the pixel electrodes 103 and the upstream gate line, with which the pixel electrode is overlapped.

The substrate 100 also includes, in the pad area, gate pad patterns 121 each formed at an end of one of the gate lines 101 in one of regions where gate pads are defined, and data pad patterns 122 each formed at an end of one of the data lines 102 in one of regions where data pads are defined. A data pattern layer 117a and a gate pad terminal 123 are formed in a laminated state over each gate pad pattern 121. A data pad terminal 133 is formed over each data pad pattern 122. The gate pad terminals 123 and data pad terminals 133 are made of a transparent electrode material forming the same layer as the pixel electrodes 103.

As shown in FIG. 9, a transparent electrode pattern 103b is formed to cover individual data lines 102 and the source electrodes 102a of the TFTs associated with the data line 102. Each pixel electrode 103 is formed on the upper surface of the drain electrode 102b in the pixel region. In FIG. 8, no transparent electrode pattern is shown. The transparent electrode pattern 103b formed on each data line 102 may be unnecessary. Accordingly, only the transparent electrode patterns 103b and pixel electrodes 103 are present on the source and drain electrodes 102a and 102b and in the pixel regions. This can be achieved by changing the shapes of opening or shielding portions of the second mask for patterning the data lines 102 and the shapes of opening or shielding portions of the third mask for patterning the pixel electrodes.

The third mask may have light transmitting portions (when the third mask is made of a photoresist film having a positive photoresistivity) corresponding to respective channel portions of the semiconductor layer because the third mask should define channels. When the third mask is made of a photoresist film having a negative photoresistivity, it may have light shielding portions. When patterning is carried out using the third mask having the above-described structure, one source electrode 102a and one drain electrode 102b are defined at portions of the data pattern layer 117a corresponding to a semiconductor layer 104 of each TFT. An amorphous silicon layer 116a is removed from a region corresponding to a channel of the semiconductor layer 104.

In the above-described structure according to the second embodiment, the storage capacitor includes a first storage electrode defined by the upstream gate line associated with the pixel region. A second storage electrode is defined by the storage pattern and pixel electrode 103 laminated together while being overlapped with the upstream gate line. A dielectric layer is defined by a gate insulating layer 114a, an amorphous silicon layer 115a, and an impurity layer 126c interposed between the first and second storage electrodes. A passivation layer 125 may be disposed over the uppermost surface of the substrate 100.

The transparent electrode layer may be disposed directly over the patterned data line layer without formation of a passivation layer over the patterned data line layer in order to enable the channel of the semiconductor layer 104 to be defined in the process for etching the transparent electrode layer. Accordingly, the source and drain electrodes 102a and 102b, transparent electrode pattern 103b, and second storage electrode 103a in each TFT region may be simultaneously formed.

As shown in FIG. 9, a gate insulating layer 114a is formed not only on the gate lines 101, gate electrodes 101a, and gate pad patterns 121, but also on the data pad area. The semiconductor layer 104 is laminated over the gate insulating layer 114a. The semiconductor layer 104 has a laminated structure including the amorphous silicon layer 115a and impurity layer (n+ layer) 116a or 126. The impurity layer 126 includes first and second impurity layers 126a and 126b which are removed from the channel regions.

As shown in FIG. 9, each gate pad terminal 123 may be formed directly on the gate pad pattern 121, using a transparent electrode material, such that the gate pad terminal 123 is in contact with the upper surface of the gate pad pattern 121. Alternatively, the data pattern layer 117a, impurity layer 116a, amorphous silicon layer 115a, and gate insulating layer 114a may be removed by a predetermined width from a region corresponding to a portion of each gate pad pattern 121, in order to expose the predetermined portion of the gate pad pattern 121. Each gate pad terminal 123 is formed using a transparent electrode material such that it covers the exposed portion of the gate pad pattern 121.

A color filter array may be formed on a second substrate (not shown) facing the substrate 100. The second substrate includes a black matrix layer formed to cover a region other than the pixel regions and the TFTs, and color filter layers formed in at least the pixel regions, and an overcoat layer formed over the entire upper surface of the second substrate including the black matrix layer and color filter layers. The substrate 100 is joined with the second substrate in a state in which a liquid crystal layer is sealed between the substrate 100 and the second substrate.

A process for manufacturing the TFT array substrate according to the second embodiment will be described. FIGS. 10A to 10D are plan views illustrating a manufacturing process of the TFT array substrate according to the second embodiment.

In accordance with this method, as shown in FIG. 10A, a gate metal layer is first deposited over the upper surface of the substrate 100. Using a first mask (not shown), the gate metal layer is selectively removed, to form a plurality of gate lines 101 extending in one direction, gate electrodes 101a protruded from portions of gate lines 101 at respective pixel regions, and gate pad patterns 121 arranged at respective gate lines 101.

A gate insulating layer 114, an amorphous silicon layer 115, an impurity layer (n$^+$ layer) 116, and a data metal layer 117 are sequentially deposited over the upper surface of the substrate 100 including the elements 101, 101a, and 121.

The data metal layer 117 may be selectively etched using a second mask (not shown) to form a data pattern layer 117a, as shown in FIG. 10B. Using the data pattern layer 117a as a mask, the impurity layer 116 and amorphous silicon layer 115 arranged beneath the data pattern layer 117a are dry-etched, and then the gate insulating layer 114 may be subsequently etched. In accordance with this process, an impurity pattern layer 116a, an amorphous silicon pattern layer 115a, and a gate insulating pattern layer 114a are formed which have a width substantially similar to that of the data pattern layer 117a.

The data pattern layer 117a is present in a region where data lines are to be formed, a region where a semiconductor layer including source and drain electrodes is to be formed, and in each data pad region. The portion of the data pattern layer 117a arranged in each data pad region is referred to as a data pad pattern 122.

Figure 10C:
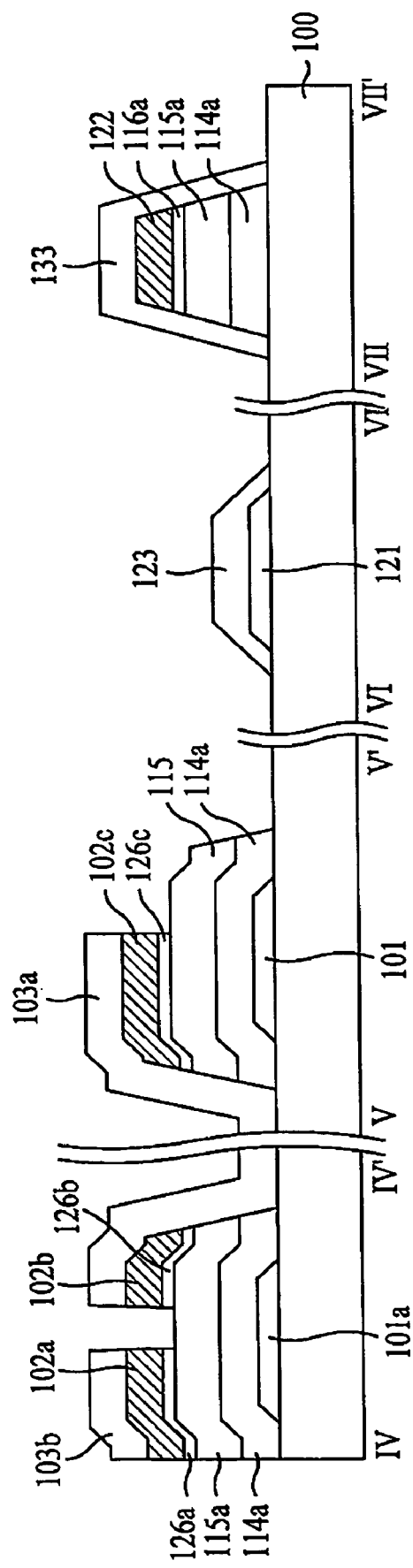

A transparent electrode layer is deposited over the data pattern layer 117a including the data pad patterns 122, as shown in FIG. 10C. Using a third mask (not shown), the transparent electrode layer may be selectively removed, thereby forming transparent electrode patterns 103b and pixel electrodes 103 on the data pattern layer 117a. The transparent electrode patterns 103b and pixel electrodes 103 are not formed on the channel regions, gate pad terminals 123 on respective gate pad patterns 121, and data pad terminals 133 on respective data pad patterns 122 and regions around the data pad patterns 122.

The gate lines 101, which are in an exposed state, may be covered by another transparent electrode pattern formed upon the patterning of the transparent electrode layer, in order to protect the surfaces of the gate lines 101. Such a transparent electrode pattern is omitted from the drawings.

Using the pixel electrodes 103 and transparent electrode patterns 103b, the portions of the data pattern layer 117a as a mask, and impurity layer 116a corresponding to respective channel regions are removed in accordance with an etching process. The portion of data pattern layer 117a left on each gate electrode 101a after completion of this etching process is defined as a source electrode 102a and a drain electrode 102b arranged at opposite sides of the channel region while being spaced apart from each other. The portions of the impurity layer 126 (126a and 126b) and amorphous silicon layer left beneath the portion of the data pattern layer 117a are collectively defined as a semiconductor layer 104. In this embodiment, the source electrode 102a has a U-shape, and the channel defined between the source electrode 102a and the drain electrode 102b also has a U-shape. Such a shape is configured to secure an increased area of the channel region. Of course, the channel region may have other shapes such as an L-shape or "-"-shape.

Figure 10D:
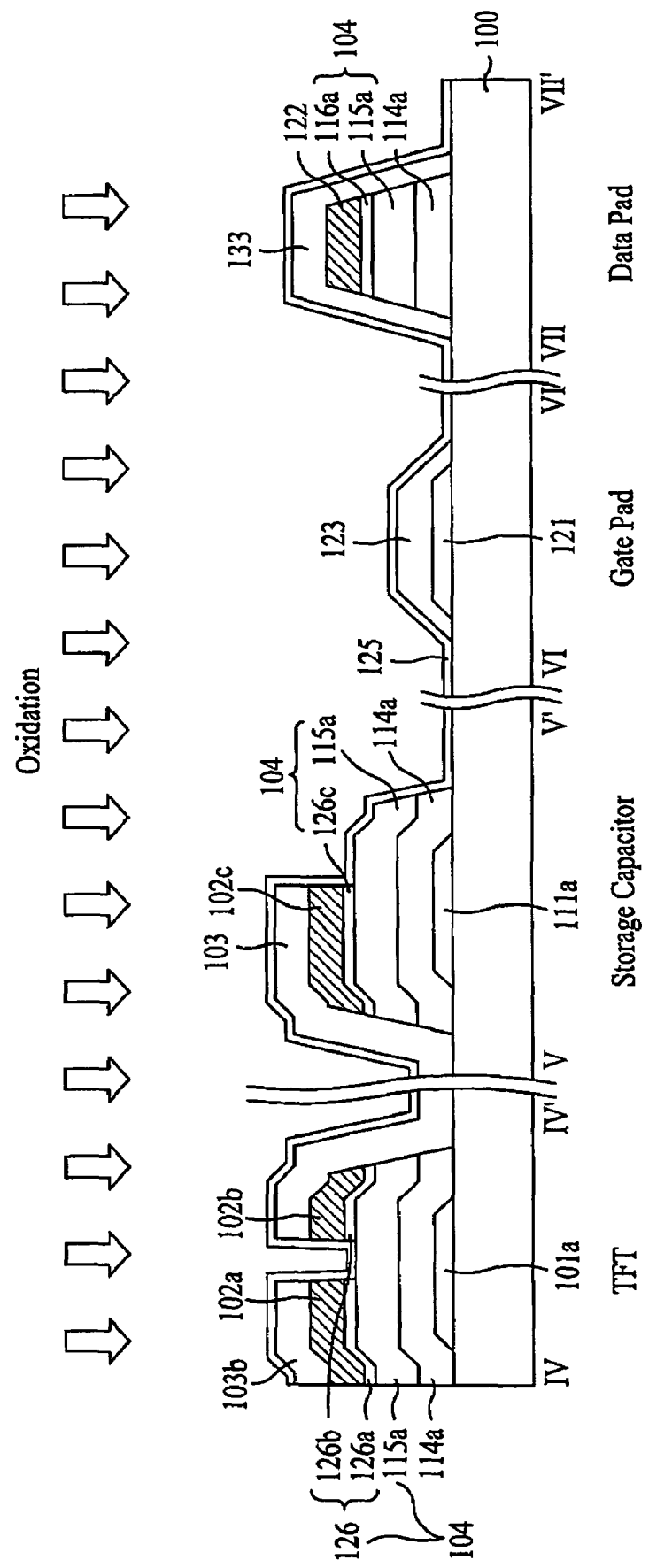

The substrate 100 may then be treated by O$_2$ plasma, to form an oxide layer (not shown) made of an oxide (SiO$_2$) over the elements formed on the substrate 100, as shown in FIG. 10D. The oxide layer may be used as a passivation layer 125. In particular, the opened channel portions of the semiconductor layer 104 may be protected from an external environment by the oxide layer.

The passivation layer 125 is formed to have a thickness of about 200 to 500 Å. The formation of such a passivation layer may be achieved by loading a single substrate into a vacuum chamber, and subjecting the substrate to a desired oxygen plasma process. Alternatively, the passivation layer formation may be achieved by loading a cassette or other device carrying a plurality of substrates into an oven, and then subjecting the substrates to a oxygen plasma process and to a thermal oxidization process. An orientation film (not shown) may be formed over the passivation layer 125 and rubbed.

The TFT array substrate manufacturing method according to the second embodiment may be achieved using three masks. In this TFT array substrate manufacture, formation of a passivation layer between the data line layer and the pixel electrodes may be unnecessary. Accordingly, the passivation layer hole formation process involved in the 4-mask process may be skipped. Also, the pixel electrodes are formed such that they are in contact with the data line layer, and each channel region is defined using the shape of the pixel electrode. Accordingly, it is possible to form a TFT array using three masks, without using an additional diffractive light exposure process.

Figure 11:
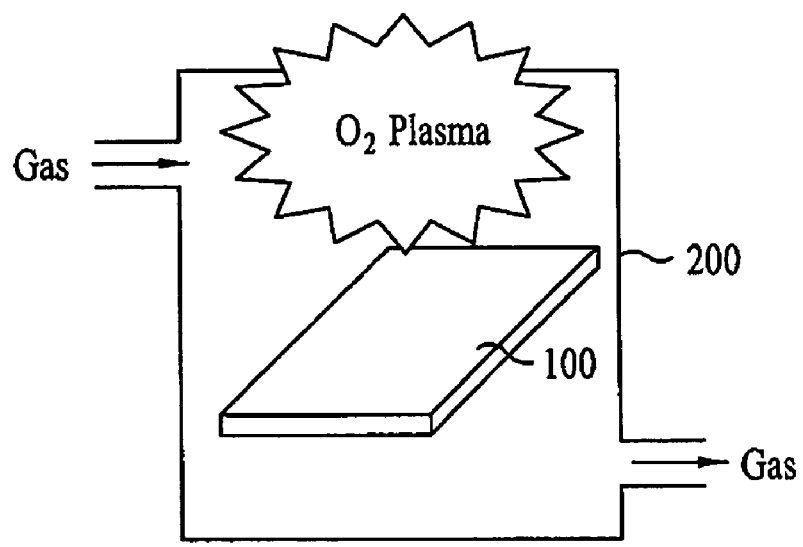
FIG. 11 is a schematic view illustrating a method used for formation of the passivation layer on the TFT array substrate in accordance with an embodiment.

A process or method for forming the passivation layer over the uppermost surface of the array formed on the substrate 100 will be described below. FIG. 11 is a schematic view illustrating a method used for formation of the passivation layer on the TFT array substrate in accordance with one embodiment.

The method illustrated in FIG. 11 uses a vacuum chamber 200 for formation of a passivation layer. Accordingly, a substrate 100 formed with a TFT array including TFTs, pixel electrodes, etc., such as the TFT array substrate of the present embodiment, is first loaded into a vacuum chamber 200. Oxygen (O$_2$) is then introduced into the vacuum chamber 200. The substrate 100 is subjected to an oxygen plasma process, so that a passivation layer 125 having a predetermined thickness may be formed over the surface of the substrate 100. In this embodiment, the vacuum chamber 200 performs the substrate treatment in the unit of one substrate.

Figure 12:
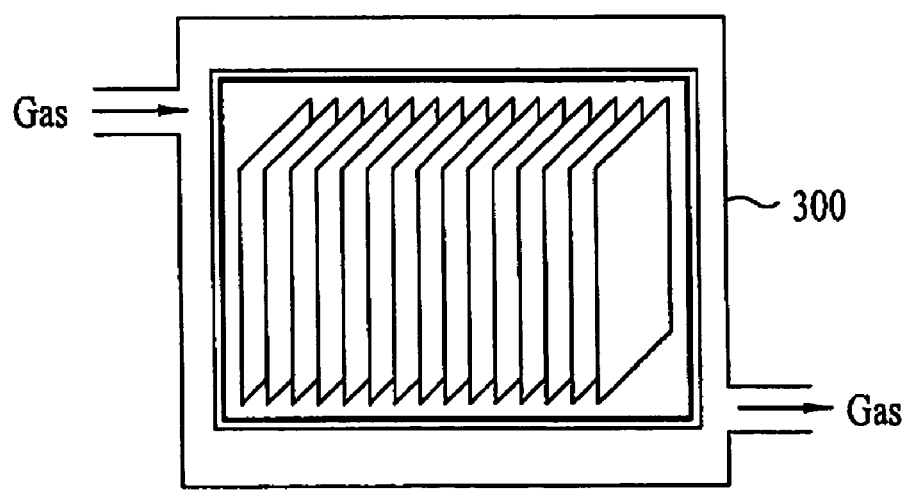
FIG. 12 is a schematic view illustrating another method used for formation of the passivation layer on the TFT array substrate in accordance with an embodiment.

FIG. 12 is a schematic view illustrating another method used for formation of the passivation layer on the TFT array substrate in accordance with an embodiment. The method illustrated in FIG. 12 uses an oven, for formation of a passivation layer. Accordingly, substrates 100 each formed with a TFT array including TFTs, pixel electrodes, etc. are first mounted in a plurality of cassettes or other devices. The cassettes are then loaded in an oven 300. Oxygen is supplied to the oven 300 under the condition in which heat is applied to the substrates 100. A passivation layer 125 is formed over the surface of each substrate 100 by the heat applied to the substrate 100. Substantially simultaneously with the formation of the passivation layer 125, heat treatment and annealing are carried out, to improve the quality of the passivation layer 125 which is an oxide layer. In this embodiment, it is possible to reduce the amount of oxygen used for the formation of the passivation layer 125 on each substrate 100, and thus, to reduce the gas costs. This method may also be implemented in a general annealing furnace. As described, there is little or no damage caused by plasma. It is also possible to grow the passivation layer 125 to a larger thickness.

The TFT array substrate and the manufacturing method thereof according to the described embodiments may have the following effects. First, a material for formation of pixel electrodes is deposited on a data line layer, without interposition of a passivation layer, as an interlayer, between the data line layer and the pixel electrode layer, after patterning the data line layer to form data lines. When the pixel electrode layer is patterned to form pixel electrodes, channels of a semiconductor layer are also defined. Accordingly, it is possible to completely form a TFT array substrate using three masks. Since no diffractive light exposure process is carried out during the channel formation, it is possible to reduce the number of light exposure processes, and to simplify the shapes of the light transmitting/shielding portions of masks.

Secondly, it is possible to simplify the overall manufacturing process by virtue of the reduced number of masks used in the manufacturing process, and thus, to achieve an increase in productivity in association with mass production. Thirdly, the TFT array substrate and manufacturing method of are applicable to LCDs of any modes, for example, an in-plane switching (IPS) mode, a twisted nematic (TN) mode, and a vertical alignment (VA) mode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description. While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method for manufacturing a thin film transistor array substrate comprising:
    forming gate lines, gate electrodes and a gate pad pattern at an end of each gate line on a substrate with a first mask
    depositing a gate insulating layer, a semiconductor formation layer, and a data metal layer on a surface of the substrate including the gate lines and the gate electrodes;
    removing at least part of the data metal layer, the semiconductor formation layer, and the gate insulating layer to have same openings with a second mask, to form data lines extending substantially perpendicular to the gate lines and a data pad pattern at an end of each data line;
    depositing a transparent electrode layer over a surface of the substrate including the data lines;
    removing at least part of the transparent electrode layer, the data metal layer, and the semiconductor formation layer to a predetermined depth from regions corresponding to channels of the semiconductor layer formation region with a third mask; and
    patterning predetermined portions of pixel regions to form a semiconductor layer on the semiconductor formation layer, source and drain electrodes on the data metal layer, a pixel electrode coupled with the drain electrode on the transparent electrode, a gate pad terminal coupled with the gate pad pattern and a data pad terminal on the data pad pattern such that the gate pad terminal and the data pad terminal are disposed on the same layer as the pixel electrode.

2. The method according to claim 1 wherein semiconductor layer formation regions remain after removing at least part of the data metal layer, the semiconductor layer formation layer, and the gate insulating layer.

3. The method according to claim 1, further comprising:
    forming a passivation layer over a surface of the substrate including the pixel electrodes.

4. The method according to claim 1 wherein the semiconductor formation layer comprises a laminated structure including an amorphous silicon layer and an impurity layer disposed over the amorphous silicon layer.

5. The method according to claim 1, further comprising:
forming common lines extending substantially parallel to the gate lines and common electrodes extending from each common line, upon formation of the gate lines while forming gate lines and gate electrodes on a substrate with the first mask.

6. The method according to claim 3, wherein the step of forming the passivation layer is processed through at least one of an oxygen plasma process, in a vacuum chamber, in an oven, or combinations thereof.

7. The method according to claim 4, wherein the impurity layer is removed from the regions corresponding to the channels when the semiconductor formation layer is removed to the predetermined depth.

8. The method according to claim 5, wherein the pixel electrodes are disposed to alternate with the common electrodes.

9. A method for manufacturing a thin film transistor array substrate, comprising:
disposing gate lines and common lines extending in substantially the same direction on a substrate and disposing common electrodes, gate electrodes, and gate pad patterns on the substrate with a first mask;
depositing a gate insulating layer, a semiconductor formation layer, and a data metal layer on a surface of the substrate including the gate lines, the common lines, the common electrodes, the gate electrodes, and the gate pad patterns;
selectively removing at least part of the data metal layer, the semiconductor formation layer, and the gate insulating layer with a second mask to form data lines extending substantially perpendicular to the gate lines and a data pad pattern at an end of each data line, wherein the data metal layer, the semiconductor layer formation layer and the gate insulating layer have same openings after the selective removal and semiconductor layer formation regions are established by the selective removal;
depositing a transparent electrode layer over a surface of the substrate including the data lines; and
removing at least part of the transparent electrode layer, the data metal layer, and the semiconductor formation layer to a predetermined depth, wherein the removal of at least part of the transparent electrode layer establishes semiconductor layers, source electrodes and drain electrodes in respective semiconductor layer formation regions, and pixel electrodes parallel to the common electrodes with a third mask.

10. The method of claim 9, further wherein the removal of at least part of the transparent electrode layer establishes pixel electrodes in respective pixel regions, gate pad terminals coupled with respective gate pad patterns, and data pad terminals coupled with respective data pad patterns.

11. The method according to claim 9, further comprising:
forming a passivation layer over a surface of the substrate.

12. The method according to claim 11, wherein the step of forming of the passivation layer is processed by at least one of an oxygen plasma process, a vacuum chamber, an oven, or combinations thereof.

* * * * *